(12) United States Patent
Chun

(10) Patent No.: US 7,417,283 B2
(45) Date of Patent: Aug. 26, 2008

(54) CMOS DEVICE WITH DUAL POLYCIDE GATES AND METHOD OF MANUFACTURING THE SAME

(75) Inventor: Yun Seok Chun, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 308 days.

(21) Appl. No.: 11/299,501

(22) Filed: Dec. 12, 2005

(65) Prior Publication Data

US 2007/0004119 A1   Jan. 4, 2007

(30) Foreign Application Priority Data

Jun. 29, 2005   (KR)   ............... 10-2005-0057164

(51) Int. Cl.
*H01L 23/62*   (2006.01)
*H01L 27/088*   (2006.01)

(52) U.S. Cl. .............. 257/331; 257/390; 257/354; 257/E29.263

(58) Field of Classification Search .......... 257/E29.263, 257/E29.345, E29.16, 331, 374, 390, 466, 257/510, 522, 523, 354, 353
See application file for complete search history.

(56) References Cited

U.S. PATENT DOCUMENTS

| | | | | |
|---|---|---|---|---|
| 5,292,677 A | * | 3/1994 | Dennison | 438/396 |
| 5,444,018 A | * | 8/1995 | Yost et al. | 438/649 |
| 5,643,819 A | * | 7/1997 | Tseng | 438/396 |
| 5,648,291 A | * | 7/1997 | Sung | 438/396 |
| 5,686,337 A | * | 11/1997 | Koh et al. | 438/240 |
| 5,705,438 A | * | 1/1998 | Tseng | 438/238 |
| 5,780,338 A | * | 7/1998 | Jeng et al. | 438/253 |
| 5,793,086 A | * | 8/1998 | Ghio et al. | 257/390 |
| 6,001,717 A | * | 12/1999 | Lien | 438/586 |
| 6,010,933 A | * | 1/2000 | Cherng | 438/253 |
| 6,083,790 A | * | 7/2000 | Lin et al. | 438/256 |
| 6,127,716 A | * | 10/2000 | Morizuka et al. | 257/503 |
| 6,171,970 B1 | * | 1/2001 | Xing et al. | 438/706 |

(Continued)

FOREIGN PATENT DOCUMENTS

KR   10-2000-0002347   1/2000

(Continued)

OTHER PUBLICATIONS

Korean Patent Gazette, Mar. 29, 2007.

*Primary Examiner*—Walter L Lindsay, Jr.
(74) *Attorney, Agent, or Firm*—Ladas & Parry LLP

(57) ABSTRACT

A CMOS device having dual polycide gates is formed by first providing a silicon substrate, which is divided into a cell area and a peripheral circuit area and has a device isolation layer, a P-well, and a N-well in the peripheral circuit area. The n+ polycide gate at the P-well and the p+ polycide gate at the N-well are formed. An interlayer dielectric layer is formed on the resultant of the silicon substrate having the n+ polycide gate and the p+ polycide gate. A first bit-line contact hole for exposing the n+ polycide gate is formed, and a second bit-line contact hole for exposing the p+ polycide gate is formed. Bit-lines with a bridge structure on the interlayer dielectric layer is formed. The bit-lines simultaneously contact the n+ polycide gate and the p+ polycide gate through the first and second bit-line contact holes.

3 Claims, 5 Drawing Sheets

U.S. PATENT DOCUMENTS

| | | | |
|---|---|---|---|
| 6,197,653 B1 * | 3/2001 | Khamankar et al. | 438/398 |
| 6,271,073 B1 * | 8/2001 | Roberts | 438/238 |
| 6,432,760 B1 | 8/2002 | Kothandaraman et al. | |
| 6,512,245 B2 * | 1/2003 | Ikeda et al. | 257/68 |
| 6,617,631 B2 * | 9/2003 | Huang | 257/296 |
| 7,253,465 B2 * | 8/2007 | Yamamoto et al. | 257/296 |
| 2002/0047156 A1 * | 4/2002 | Kim | 257/331 |
| 2002/0127867 A1 * | 9/2002 | Lee | 438/694 |
| 2004/0232497 A1 * | 11/2004 | Akiyama et al. | 257/390 |
| 2005/0139884 A1 * | 6/2005 | Lane | 257/296 |
| 2007/0004119 A1 * | 1/2007 | Chun | 438/199 |

FOREIGN PATENT DOCUMENTS

| | | |
|---|---|---|
| KR | 10-2002-0073642 | 9/2002 |
| KR | 10-2004-0090476 | 10/2004 |

* cited by examiner

CMOS DEVICE WITH DUAL POLYCIDE GATES AND METHOD OF MANUFACTURING THE SAME

BACKGROUND OF THE INVENTION

1. Field of the Invention

The present invention relates generally to a CMOS device and a method of manufacturing the same, and more particularly to a CMOS device with dual polycide gates and a method of manufacturing the same, which is capable of stabilizing gate characteristic of peripheral circuit region.

2. Description of the Prior Art

As well known in the art, a gate of a MOS device has been primarily made from polysilicon. This is because the polysilicon has proper physical characteristics for a gate, such as a high melting point, facilitation of thin film formation, facilitation of a line pattern, stabilization for an oxide atmosphere, and flat surface formation. Further, in the case where the polysilicon is actually applied to MOSFET device, the gate made from the polysilicon implies dopant such as Phosphorus, Arsenic, Boron, etc. and achieves a low resistance.

However, with increasing integration of MOS devices, the line widths and resistance of gates should decrease. In order to achieve low resistance in the fine lines having the narrow width in highly integrated devices, research has been actively undertaken in pursuit of a transitional metal polycide gate, which will have the structure in which a transitional metal-silicide, such as tungsten silicide, titanium silicide, nickel silicide and the like, and polysilicon are stacked instead of an existing polysilicon gate. Especially, the tungsten silicide of the transitional polycides can realize a low resistance on a fine wire width, and satisfies characteristics required as the gate. Thus, the tungsten silicide is expected to have a use in manufacturing large integrated devices.

On the other hand, CMOS device has n+ polysilicon gate formed in all of NMOS and PMOS regions. In this case, there is a problem in that a buried channel is formed by a counter-doping in the PMOS region, which thereby increases a short channel effect.

As an attempt to solve the problem above problem, a method of forming a dual gate has recently been used, in which n+ polysilicon gate is formed in NMOS region and p+ polysilicon gate is formed in PMOS region. The dual gate forming method solves the problem due to the buried channel by forming surface channels in both the NMOS and PMOS regions.

Further, a technology for forming dual polycides, which includes a dual gate forming technology and a polycide gate forming technology grafted together, has been proposed. In order to realize a gate in a highly integrated device having low resistance as well as being able to restrict the short channel effect, the technology for forming dual polycides is necessary.

Hereinafter, a method of manufacturing CMOS device with dual polycide gates according to a conventional art will be described in brief with reference to FIGS. 1A to 1D.

Referring to FIG. 1A, after a device isolation layer 2 is formed in a silicon substrate 1 to define an active region, masking process and ion implant process as well-known are performed to form P-well 3a and N-well 3b on the silicon substrate 1. Then, a gate oxide layer 4 and a polysilicon layer 5 are sequentially formed on the silicon substrate 1 on which the device isolation layer 2 and the wells 3a and 3b.

Referring to FIG. 1B, the masking and ion implantation processes are performed by known methods to form n+ polysilicon layer 5a and p+ polysilicon layer 5b in the P-well 3a and the N-well 3b, respectively.

Referring to FIG. 1C, a metal silicide layer 6 and a hard mask layer 7 are sequentially formed on polysilicon layers 5a and 5b of which regions are differently doped.

Next, though not shown in detail herewithin, after the hard mask layer 7 is patterned to define the gate region, the metal silicide layer 6, the doped polysilicon layers 5a and 5b, and the gate oxide layer 4 below the patterned hard mask 7 are sequentially etched by using the patterned hard mask 7 as an etching barrier, thereby forming the dual polycide gate including n+ polycide gate 10a for NMOS and p+ polycide gate 10b for PMOS.

Referring to FIG. 1D, an insulating interlayer 8 is formed on the resultant to cover the dual polycide gate. Then, after the insulating interlayer 8 and the hard mask layer 7 are etched to form a bit line contact hole 9, a bit-line 15 contacting the metal silicide layer of the dual polycide gates 10a, 10b is formed on the insulating interlayer 8.

FIG. 1E is a plan view showing a CMOS device manufactured by the method of FIG. 1D, where FIG. 1D is a cross-sectional view taken along the line A-A' in FIG. 1E. As shown in FIG. 1E, the dual polycide gate 10, i.e. continuous word-lines are transversely arranged, while the bit-lines 15 are longitudinally arranged perpendicularly to the word-lines. The bit-line 15 contacts the corresponding one of the word-lines at the "contact" point as shown FIG. 1E, which more exactly is at the boundary between the NMOS and PMOS.

In the conventional method of forming dual polycide gate as described above, however, a dopant inter-diffusion may likely occur between the NMOS and PMOS in the peripheral circuit region.

Specifically, since the n+ polysilicon layer 5a of the NMOS and the p+ polysilicon layer 5b of PMOS are adjacent to each other in the peripheral circuit region, n type impurity and p type impurity doped in the n+ polysilicon layer 5a and p+ polysilicon layer 5b, respectively, are inter-diffused through the metal silicide layer, so as to cause a counter-doping effect in each gate polysilicon layer in an annealing process for a formation of the interlayer dielectric layer and a succeeding process. Thus, a serious gate depletion effect occurs, in which a sufficient concentration of impurities in each gate polysilicon layer quickly decreases. As a result, the electrical characteristics of the device will degrade (e.g. the threshold voltage changes). Even worse, it may cause a transistor to lose its on/off operational capability.

In addition, the distance between devices in the peripheral circuit region has decreased in the highly integrated semiconductor devices. Therefore, the likelihood of dopant inter-diffusion between the gate of the NMOS and the gate of the PMOS increase as the devices are further highly integrated. It is expected that the gate depletion effect will be more serious due to this dopant inter-diffusion.

SUMMARY OF THE INVENTION

Accordingly, the present invention has been developed in order to solve the above-mentioned problems occurring in the prior art, and an object of the present invention is to provide a CMOS device and a method of manufacturing the same, which can prevent a dopant inter-diffusion between gates of an NMOS and a PMOS in a peripheral circuit region.

Another object of the present invention is to provide a CMOS device and a method of manufacturing the same, which can stabilize gate characteristics in a peripheral circuit region.

Still another object of the present invention is to provide a CMOS device and a method of manufacturing the same, which can stabilize gate characteristics so as to improve a device characteristic.

In order to accomplish these objects of the present invention, according to an aspect of the present invention, there is provided a CMOS device which comprises: a silicon substrate divided into a cell area and a peripheral circuit area, and having a device isolation layer, a P-well, and a N-well in the peripheral circuit area; n+ polycide gate formed in P-well region of the peripheral circuit area of the substrate, and p+ polycide gate formed in N-well region of the peripheral circuit area of the substrate so as to be separated from the n+ polycide gate; an interlayer dielectric layer formed on a resultant of the silicon substrate having the n+ polycide gate and the p+ polycide gate, and including a first bit-line contact hole for exposing the n+ polycide gate and a second bit-line contact hole for exposing the p+ polycide gate; and bit-lines formed on the interlayer dielectric layer to have a bridge structure, and simultaneously contacting with the n+ polycide gate and the p+ polycide gate which are separated from each other, through the first and second bit-line contact holes.

Here, the n+ polycide gate is formed with a stack layer including a gate insulation layer, a silicon layer in which n-type impurity is implanted, a metal silicide layer, and a hard mask layer, while the p+ polycide gate is formed with a stack layer including the gate insulation layer, a silicon layer in which p-type impurity is implanted, the metal silicide layer, and the hard mask layer.

The bit-lines are formed to contact with each metal silicide layer of the n+ polycide gate and the p+ polycide gate.

In order to accomplish these objects of the present invention, according to another aspect of the present invention, there is provided a method of manufacturing a CMOS device which has dual polycide gate, which comprises the steps of: providing a silicon substrate which is divided into a cell area and a peripheral circuit area and has a device isolation layer, a P-well, and a N-well in the peripheral circuit area; forming the n+ polycide gate at the P-well in the peripheral circuit area of the substrate and the p+ polycide gate at the N-well in the peripheral circuit area of the substrate so as to be separated from the n+ polycide gate, the n+ polycide gate being formed with a stack layer including a gate insulation layer, a silicon layer in which n-type impurity is implanted, a metal silicide layer, and a hard mask layer, while the p+ polycide gate is formed with a stack layer including the gate insulation layer, a silicon layer in which p-type impurity is implanted, the metal silicide layer, and the hard mask layer; forming an interlayer dielectric layer on a resultant of the silicon substrate having the n+ polycide gate and the p+ polycide gate; forming a first bit-line contact hole for exposing the n+ polycide gate and a second bit-line contact hole for exposing the p+ polycide gate; and forming bit-lines with a bridge structure on the interlayer dielectric layer, the bit-lines simultaneously contacting with the n+ polycide gate and the p+ polycide gate, which are separated from each other, through the first and second bit-line contact holes.

According to another aspect of the present invention, the step of forming the n+ polycide gate and the p+ polycide gate comprises the sub-steps of: forming a gate insulation layer and a silicon layer in the substrate, sequentially; selectively ion-implanting n-type impurity in a portion of the silicon layer formed at the P-well region in the peripheral area of the substrate, while selectively ion-implanting p-type impurity in a portion of the silicon layer formed at the N-well region in the peripheral area of the substrate; sequentially forming the metal silicide layer and the hard mask layer on the silicon layer of each region in which the n-type and p-type impurities are ion-implanted; and etching the hard mask layer, the metal silicide layer, the silicon layer, and the gate insulation layer.

The silicon layer is formed in an armorphos state.

The n-type impurity ion implant is performed by using Phosphorus or Arsenic, while the p-type impurity ion implant is performed by using Boron or Boron difluoride.

The metal silicide layer is formed with a tungsten silicide layer.

BRIEF DESCRIPTION OF THE DRAWINGS

The above and other objects, features, and advantages of the present invention will be more apparent from the following detailed description taken in conjunction with the accompanying drawings, in which:

FIG. 1D is a cross-sectional view taken along the line A-A' in FIG 1E;

FIG. 2D is a cross-sectional view taken along the line B-B' in FIG. 2E.

DETAILED DESCRIPTION OF THE PREFERRED EMBODIMENTS

Hereinafter, a preferred embodiment of the present invention will be described with reference to the accompanying drawings.

FIGS. 2A to 2D are cross-sectional views for illustrating a method of manufacturing a CMOS device according to an embodiment of the present invention, in which processes are shown step by step.

Figure 2A:
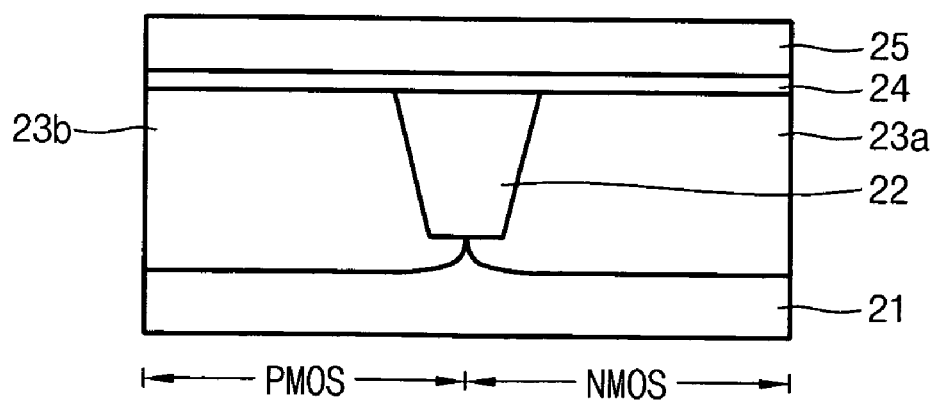
FIGS. 2A to 2D are cross-sectional view for illustrating a method of manufacturing a CMOS device according to an embodiment of the present invention.

Referring to FIG. 2A, a device isolation layer 22 is formed to define an active region in each area of a silicon substrate 21 having a cell area and a peripheral circuit area, according to a shallow trench isolation process, and in turn an existing mask process and ion implantation process are performed, so as to form a P-well 23a and a N-well 23b in the peripheral circuit area of the silicon substrate 21. Thereafter, an oxide layer 24 is formed as a gate insulation layer on the silicon substrate 21 on which the device isolation layer 22, and wells 23a and 23b are formed, and then a silicon layer 25 for a gate is formed on the oxide layer 24.

Here, the oxide layer 24 is formed at a thickness of 20~60 Å according to a wet oxidation process. Further, the oxide layer 24 may have a oxynitride layer formed by nitrifying a surface of the oxide layer in order to restrain boron from penetrating in the oxide layer 24 during a subsequent ion implantation process. An amorphous silicon layer is preferably used as the silicon layer 25 for the gate, but if necessary, a polysilicon layer instead of the amorphous silicon layer can be used as the silicon layer 25 for the gate.

Figure 2B:
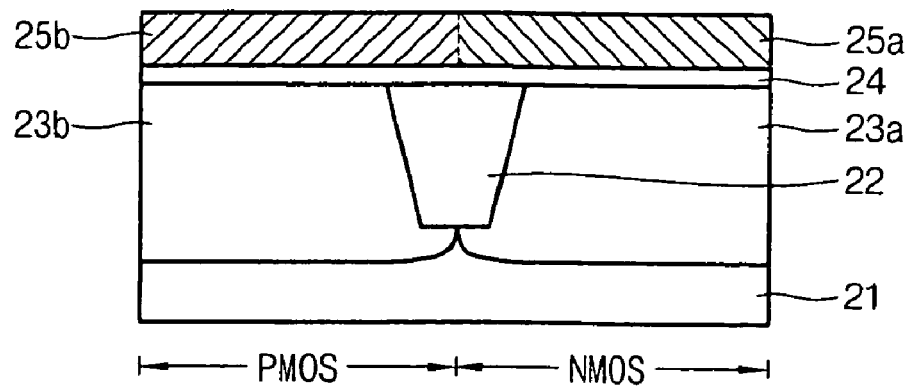

Referring to FIG. 2B, n-type impurity is selectively ion-implanted on the silicon layer 25 in the P-well 23a region of the peripheral circuit area of the substrate, so as to form the n+ silicon layer 25a, while p-type impurity is selectively ion-implanted on the silicon layer 25 in the N-well region 23a of the peripheral circuit area of the substrate, so as to form the p+ silicon layer 25b. Here, the n-type of impurity ion implantation is carried out using Phosphorus or Arsenic, while the p type impurity ion implantation is carried out using Boron or Boron difluoride.

Figure 2C:
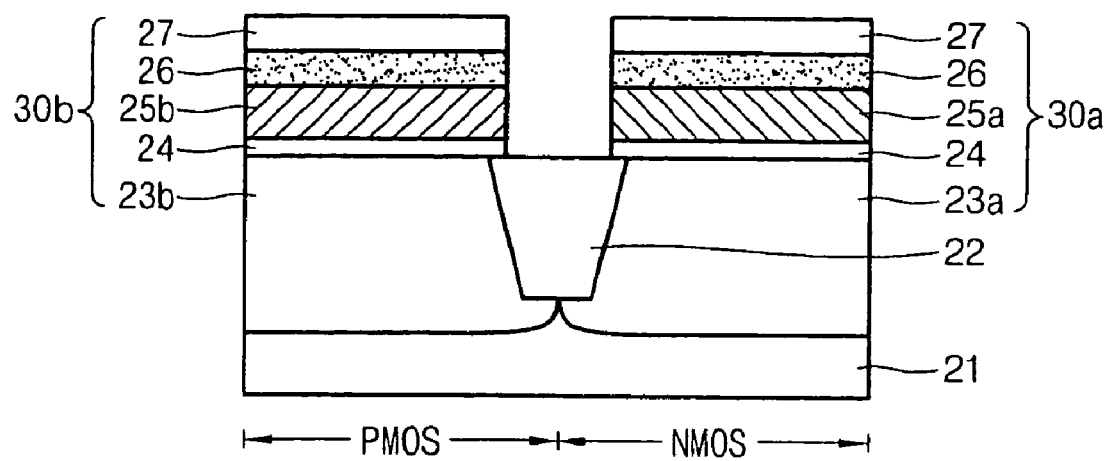

Referring to FIG. 2C, a metal silicide layer 26, such as a tungsten silicide layer, and a hard mask layer 27 are sequentially formed on the silicon layers 25a and 25b in which different conductive-impurities are implanted. Then, the hard mask layer 27 is patterned. The patterning of the hard mask layer 27 is carried out in order to form a discontinuous gate (word-line) in which the gate of NMOS and the gate of PMOS are divided.

Figure 1A:
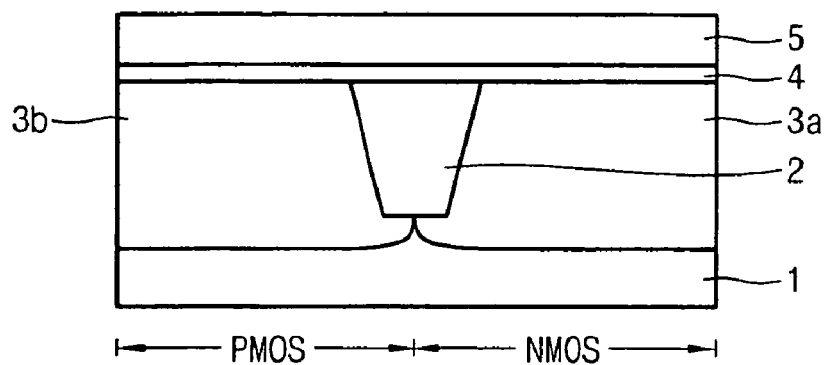
FIGS. 1A to 1D are cross-sectional views for illustrating a method of manufacturing a CMOS device according to a conventional art, in which processes are shown step by step.
Figure 1B:
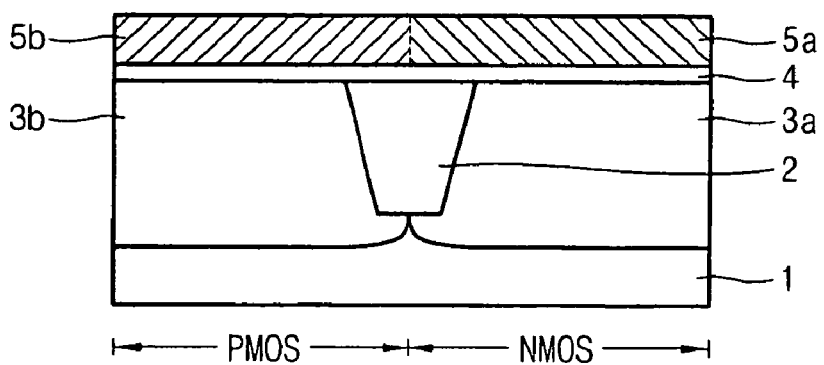
Figure 1C:
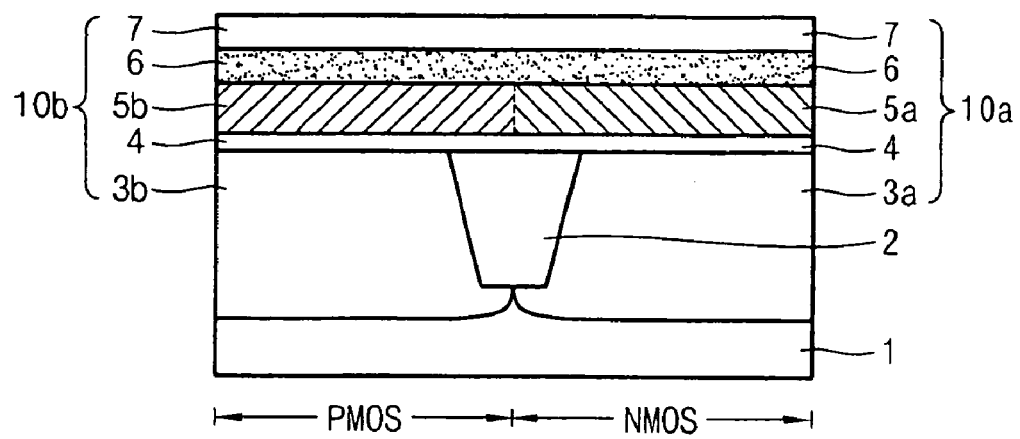
Figure 1D:
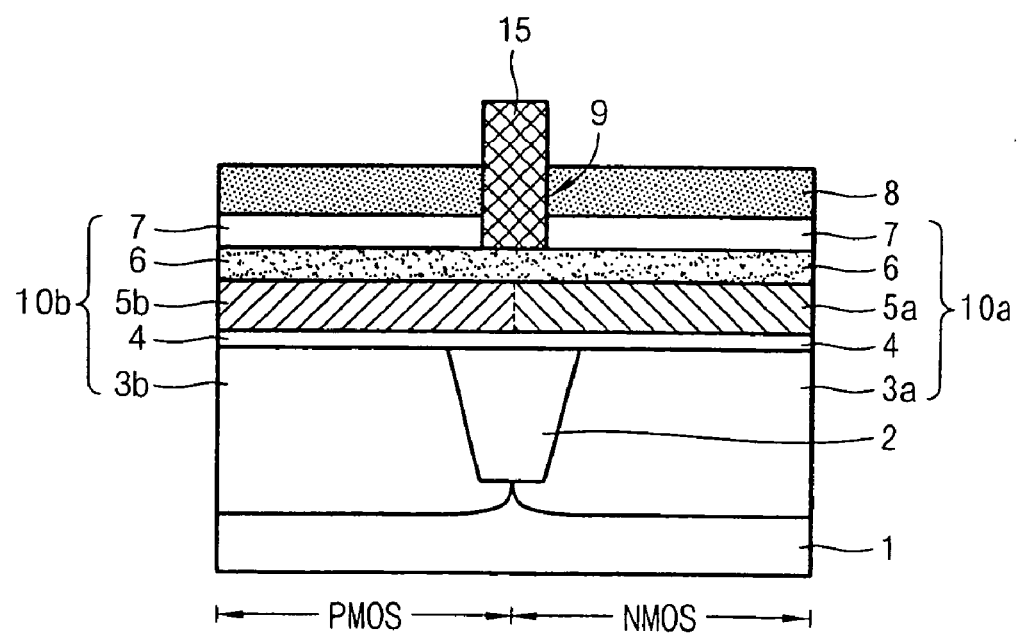
Figure 1E:
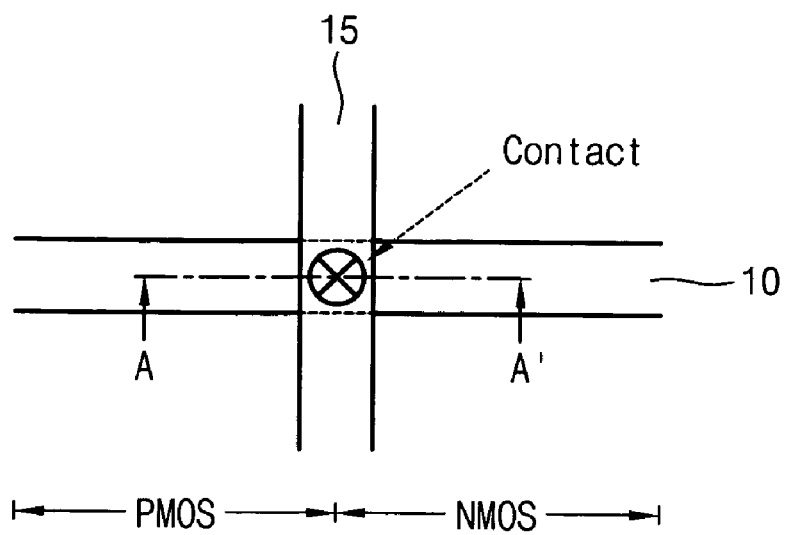
FIG. 1E is a plan view showing a CMOS device manufactured by the process of FIG. 1D, where

Next, the metal silicide layer 26, the silicon layer 25a and 25b, and the oxide layer 24 which are below the patterned hard mask 27, are sequentially etched by using the patterned hard mask 27 as an etching barrier. At a result, n+ polycide gate 30a is formed on the P-well 23a of the peripheral circuit area of the substrate, while p+ polycide gate 30b are formed on the N-well 23b of the peripheral circuit area of the substrate so as to be separated from the n+ polycide gate 30a. That is, unlike the prior art example, the n+ silicon layer 25a and the p+ silicon layer 25b are separated by the above etching process as shown in FIG. 1C.

According to an embodiment of the present invention, here, the n+ polycide gate 30a of NMOS and the p+ polycide gate 30b of PMOS are separated from each other as described above, and the separation prevents dopant inter-diffusion between the n+ polycide gate 30a of NMOS and the p+ polycide gate 30b of PMOS. Thus, it is possible to prevent the gate depletion effect caused by dopant inter-diffusion.

Figure 2D:
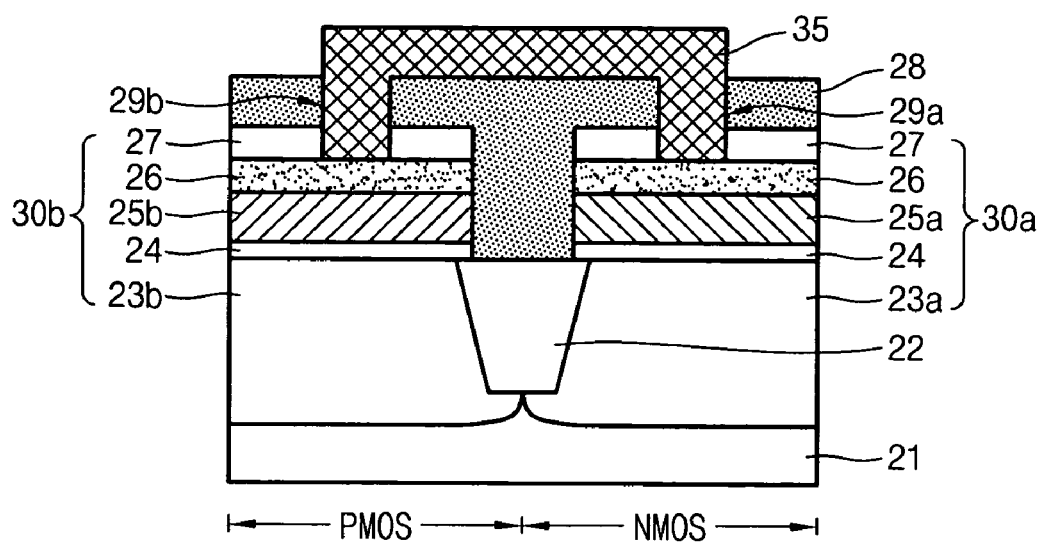

Referring to FIG. 2D, the interlayer dielectric layer 28 is formed on a resultant of the silicon substrate to cover the n+ polycide gate 30a of the NMOS and the p+ polycide gate 30b of the PMOS, and then the interlayer dielectric layer 28 and the hard mask layer 27 are selectively etched, so as to form the first and second bit-line contact holes 29a and 29b exposing the metal silicide layer 26 of the n+ polycide gate 30a and the metal silicide layer 26 of the p+ polycide gate 30b. Next, the conductive substance, such as tungsten, is deposited in order to bury the first and second bit-line contact holes 29a and 29b in the interlayer dielectric layer 28, and then the deposited layer is patterned, so as to form a bit-line 35 having a bridge structure and contacting with the n+ polycide gate 30a and the p+ polycide gate 30b.

Figure 2E:
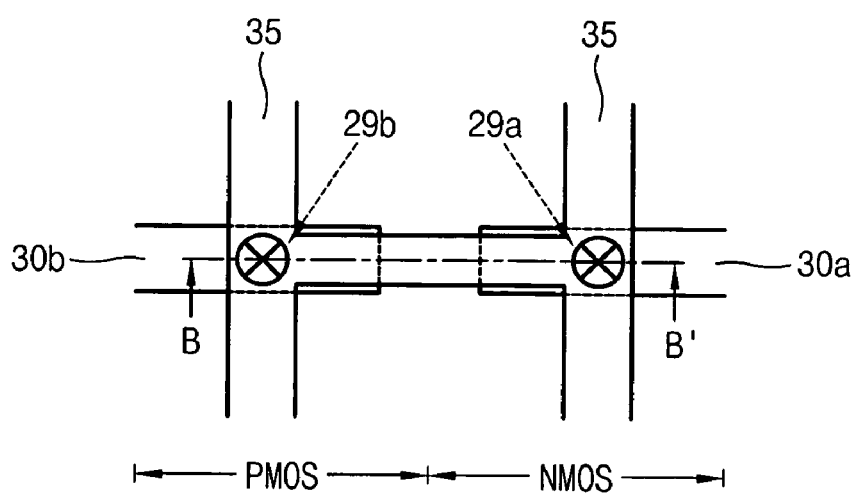
FIG. 2E is a plan view showing a CMOS device manufactured by the process of FIG. 2E according to an embodiment of present invention, where

FIG. 2E is a plan view of a CMOS device manufactured according to an embodiment of the present invention as shown in FIG. 2D, where FIG. 2D is a cross-sectional view taken along the line B-B' of FIG. 2E. As shown in FIG. 2D, the dual polycide gates including n+ polycide gate 30a and p+ polycide gate 30b, i.e. the word-lines are discontinuously formed in each of the NMOS region and the PMOS region, respectively, while the bit-lines 35 have the structure in which the contacts, i.e. bit-line contacts formed at two points at which the bit-lines 35 contact the n+ polycide gate 30a and the p+ polycide gate 30b, are bridged to connect the separated n+ and p+ polycide gates 30a and 30b to each other.

In the conventional art, the word-line is continuous and there is only a bit-line contact region. In the present invention, however, the word-lines are discontinuous and electrically connected to each other by the bit-lines 35. Thus, the present invention can realize a CMOS device in which the dopant inter-diffusion between the n+ polycide gate of NMOS and the p+ polycide gate of PMOS and the gate depletion effect caused by the dopant inter-diffusion can be effectively prevented.

Thereafter, well-known processes are successively performed in order to accomplish the semiconductor device of the present invention not shown.

As described above, in the method of manufacturing the CMOS device having dual gates in the peripheral circuit area, the n+ polycide gate and p+ polycide gate are formed in the N-well and P-well regions, respectively, and then the bit-line is formed to contact with the n+ polycide gate and the p+ polycide gate, thereby fundamentally preventing the dopant inter-diffusion between the NMOS and the PMOS.

Accordingly, the present invention can reduce an electric characteristic of the device, such as a threshold voltage characteristic, and effectively restrain the gate depletion effect causing the malfunction of the transistor. As a result, the reliability and yield of the device can be improved.

Furthermore, since the present invention can solve the gate depletion effect of the peripheral circuit area, which is a critical problem in technology used in a manufacture of CMOS device having the dual polycide gates in order to realize a very large scale of integrated device, there is an advantage in that it is capable of being profitably applied to a manufacture of a next generation of the very large scale of integrated device.

While a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A CMOS device comprising:
   a silicon substrate having a cell area and a peripheral circuit area, the silicon substrate having a device isolation layer between a P-well region and a N-well region in the peripheral circuit area;
   n+ polycide gate having at least a first metal silicide layer formed on the P-well region of the substrate;
   p+ polycide gate having at least a second metal silicide layer formed on the N-well region of the substrate, wherein the n+ polycide gate and the p+ polycide gate are separated from each other;
   an interlayer dielectric layer formed on a predetermined portion of the n+ polycide gate and a predetermined portion of the p+ polycide gate and on a portion of the substrate between the separated n+ and p+ polycide gates; and
   a bit-line having a first end and a second end formed on the interlayer dielectric layer, wherein the first end is connected to the n+ polycide gate and the second end is connected to the p+ polycide gate such that a bridge structure is formed over the interlayer dielectric layer, thereby simultaneously contacting the separated n+ polycide gate and the p+ polycide gate.

2. The CMOS device as claimed in claim 1, wherein the n+ polycide gate is formed as a stack layer comprising: a gate insulation layer, a silicon layer in which n-type impurity is implanted, a metal silicide layer, and a hard mask layer; and wherein the p+ polycide gate is formed as a stack layer comprising the gate insulation layer, a silicon layer in which p-type impurity is implanted, the metal silicide layer, and the hard mask layer.

3. The CMOS device as claimed in claim 2, wherein the bit-lines are formed such that the first end contacts the first metal silicide layer of the n+ polycide gate and the second end contacts the second metal silicide layer of the p+ polycide gate.

* * * * *